United States Patent
Liu et al.

(10) Patent No.: US 10,997,903 B2
(45) Date of Patent: May 4, 2021

(54) DISPLAY PANEL, METHOD OF CONTROLLING DISPLAY PANEL AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Danjuan Liu, Beijing (CN); Chunbing Zhang, Beijing (CN); Shou Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/593,500

(22) Filed: Oct. 4, 2019

(65) Prior Publication Data

US 2020/0251052 A1 Aug. 6, 2020

(30) Foreign Application Priority Data

Feb. 1, 2019 (CN) .......................... 201910103283.5

(51) Int. Cl.
*G09G 3/3208* (2016.01)
*G02B 26/00* (2006.01)
(Continued)

(52) U.S. Cl.
CPC ......... *G09G 3/3208* (2013.01); *G02B 26/005* (2013.01); *G06F 3/03542* (2013.01);
(Continued)

(58) Field of Classification Search
CPC .............. G02B 26/005; G06F 3/03542; G06F 3/03545; G06F 3/042; G09G 3/3208;
(Continued)

(56) References Cited

U.S. PATENT DOCUMENTS

2004/0252867 A1 12/2004 Lan et al.
2006/0109260 A1 5/2006 Sui et al.
(Continued)

FOREIGN PATENT DOCUMENTS

CN 1922470 A 2/2007
CN 101739187 A 6/2010
(Continued)

OTHER PUBLICATIONS

1st Chinese Office Action, English Translation.
(Continued)

*Primary Examiner* — Michael Pervan
(74) *Attorney, Agent, or Firm* — Brooks Kushman P.C.

(57) ABSTRACT

The present disclosure relates to a display panel, a control method thereof, and a display device. The display panel includes a substrate and a plurality of pixel units. A plurality of pixel units is on the substrate; each pixel unit includes a sub-pixel unit, a control unit, and a protection unit. The control unit is electrically connected to the sub-pixel unit. After the sub-pixel unit is in the display state, the protection unit is configured to prevent the control unit from receiving an interference signal.

18 Claims, 3 Drawing Sheets

(51) Int. Cl.
*G06F 3/0354* (2013.01)
*G06F 3/042* (2006.01)
*H01L 27/32* (2006.01)
*H01L 51/52* (2006.01)

(52) U.S. Cl.
CPC .......... *G06F 3/03545* (2013.01); *G06F 3/042* (2013.01); *G09G 2330/04* (2013.01); *G09G 2354/00* (2013.01); *G09G 2360/14* (2013.01); *H01L 27/3206* (2013.01); *H01L 27/3232* (2013.01); *H01L 51/5218* (2013.01); *H01L 51/5234* (2013.01); *H01L 2251/308* (2013.01)

(58) Field of Classification Search
CPC .......... G09G 2330/04; G09G 2354/00; G09G 2360/14; H01L 27/3206; H01L 27/3232; H01L 51/5218; H01L 51/5234; H01L 2251/308
See application file for complete search history.

(56) References Cited

U.S. PATENT DOCUMENTS

| | | |
|---|---|---|
| 2010/0108409 A1 | 5/2010 | Tanaka et al. |
| 2010/0118002 A1 | 5/2010 | Yamashita et al. |
| 2017/0097702 A1 | 4/2017 | Chang et al. |

FOREIGN PATENT DOCUMENTS

| | | |
|---|---|---|
| CN | 101739954 A | 6/2010 |
| CN | 102999230 A | 3/2013 |
| CN | 104051488 A | 9/2014 |
| CN | 105144041 A | 12/2015 |
| CN | 107274823 A | 10/2017 |
| CN | 107944334 A | 4/2018 |
| CN | 109196524 A | 1/2019 |
| CN | 109271057 A | 1/2019 |
| KR | 20180038119 A | 4/2018 |
| WO | 9308559 A1 | 4/1993 |

OTHER PUBLICATIONS

CN1922470A, English Abstract and Machine Translation.
CN101739187A, English Abstract and U.S. Equivalent U.S. Pub. No. 20100108409.
CN101739954A, English Abstract and U.S. Equivalent U.S. Pub. No. 20100118002.
CN102999230A, English Abstract and Machine Translation.
CN104051488A, English Abstract and Machine Translation.
CN105144041A, English Abstract and Machine Translation.
CN107274823A, English Abstract and Machine Translation.
CN107944334A, English Abstract and Machine Translation.
CN109196524A, English Abstract and Machine Translation.
CN109271057A, English Abstract and Machine Translation.
KR20180038119A, English Abstract and Machine Translation.
First Office Action for Chinese Application No. 201910103283.5, dated Jul. 1, 2020, 9 Pages.

DISPLAY PANEL, METHOD OF CONTROLLING DISPLAY PANEL AND DISPLAY DEVICE

CROSS-REFERENCE TO RELATED APPLICATION

This application claims priority to Chinese Patent Application No. 2019101032815 filed on Feb. 1, 2019, which is incorporated herein by reference in its entirety.

TECHNICAL FIELD

The present disclosure relates to the field of display technologies, and in particular, to a display panel, a method of controlling the display panel and a display device.

BACKGROUND

With vigorous development of the display industry, paperless and automatic working has been greatly improved. A handwriting screen has replaced the blackboard in certain fields because of its convenient writing, strong reusability and good environmental performance.

However, anti-interference ability of the handwriting screen in the related art is relatively weak, especially in various complicated environments, such as factories and outdoors.

SUMMARY

The present disclosure provides a display panel, a method of controlling the display panel and a display device.

In a first aspect, a display panel is provided according to some embodiments of the present disclosure, including:

a substrate:

a plurality of pixel units on the substrate;

each of the pixel units includes a sub-pixel unit, a control unit and a protection unit; the control unit is electrically connected to the sub-pixel unit; in the case that the sub-pixel unit is in a display state, the protection unit is configured to prevent the control unit from receiving an interference signal.

In some embodiments, the control unit may include a power source, a photosensitive switch and a light-emitting device; the power source, the photosensitive switch, and the light-emitting device are sequentially connected in series; and the power source is further connected to the sub-pixel unit via the photosensitive switch.

The photosensitive switch switches to a closed state after receiving light in a specified wavelength band, the sub-pixel unit is in the display state.

The light-emitting device is powered, and emits the light in the specified wavelength band to the photosensitive switch to maintain the photosensitive switch in the closed state.

In some embodiments, the control unit may further include a reset signal input terminal; the reset signal input terminal is connected to a connection node between the photosensitive switch and the light-emitting device.

In the case that the reset signal input terminal receives a reset signal, the photosensitive switch is switched to a shutdown state.

In some embodiments, the control unit can further include a resistor; the resistor is connected in series between the power source and the photosensitive switch.

In some embodiments, the light-emitting device can be grounded.

In some embodiments, the photosensitive switch can be a phototriode; the light-emitting device can be a LED.

The light emitted by the LED is illuminated on a channel of the phototriode.

In some embodiments, the protection unit may be above the control unit.

In the case that the protection unit is in a light-transmitting state, the photosensitive switch receives the light in the specified wavelength band, and the photosensitive switch is switched to the closed state.

In the case that the photosensitive switch is maintained in the closed state, the protection unit is switched to an opaque state for preventing the photosensitive switch from receiving the interference signal.

In some embodiments, the protection unit may include two transparent electrodes and an electrowetting unit between the two transparent electrodes.

In the case that there is an electric field between the two transparent electrodes, the electrowetting unit is in the light-transmitting state, and the protection unit is in the light-transmitting state.

In the case that there is no electric field between the two transparent electrodes, the electrowetting unit is in the opaque state, and the protection unit is in the opaque state.

In some embodiments, the electrowetting unit can include a closed housing, water and charged oil.

The water and the charged oil are in the housing.

In the case that there is the electric field between the two transparent electrodes, the charged oil is in a contracted state, and the electrowetting unit is in the light-transmitting state.

In the case that there is no electric field between the two transparent electrodes, the water surface is covered with the charged oil, and the electrowetting unit is in the opaque state.

In some embodiments, a material of the two transparent electrodes may be a piezoelectric material.

In a second aspect, a display device is provided according to some embodiments of the present disclosure, including the display panel as described above.

In a third aspect, a method of controlling a display panel is provided according to some embodiments of the present disclosure. The display panel includes a substrate and a plurality of pixel units on the substrate; each of the pixel units includes a sub-pixel unit, a control unit and a protection unit; the control unit is electrically connected to the sub-pixel unit. The method includes;

controlling the sub-pixel unit to be in a display state by the control unit in the case that the control unit receives a display signal;

preventing the control unit from receiving an interference signal by the protection unit in the case that the sub-pixel unit is in the display state.

It should be understood that the above general description and the following detailed description are intended to be illustrative and not restrictive, which does not limit the present disclosure.

BRIEF DESCRIPTION OF THE DRAWINGS

The accompanying drawings herein are incorporated into the specification and form a part of the specification, which show the embodiments consistent with the present disclosure and are used to explain the principles of the present disclosure together with the specification.

DETAILED DESCRIPTION

Exemplary embodiments will be described in detail herein, examples of which are illustrated in the accompanying drawings. The following description refers to the same or similar elements in the different figures unless otherwise indicated. The embodiments described in the following exemplary embodiments do not represent all embodiments consistent with the present disclosure. Instead, they are merely examples of devices and methods consistent with aspects of the present disclosure as detailed in the appended claims.

Figure 1:
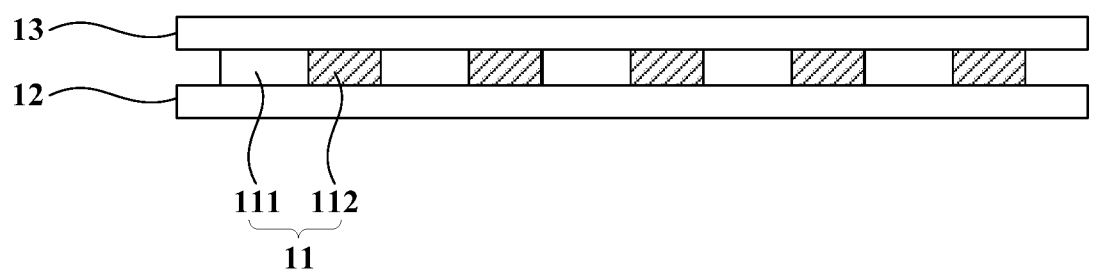
FIG. 1 is a schematic structural diagram of a handwriting screen according to a related art.

In the related art, a structure of a display panel applied to the handwriting screen is as shown in FIG. 1. Pixel units 11 are between a lower substrate 12 and an upper substrate 13. Each of the pixel units 11 may include a sub-pixel unit 112 and a control unit 111. The control unit 111 is configured to receive a control signal to control operating states of the sub-pixel unit. The operating states of the sub-pixel unit include a display state and a shutdown state.

However, a thin film transistor in the control unit 111 described above easily receives an interference signal to cause a misoperation of the handwriting screen, resulting in display abnormality, especially during outdoor use.

The embodiments of the present disclosure provide a display panel, a method of controlling the display panel and a display device, which are used to solve the above technical problems and can improve anti-interference capability of the display panel.

Figure 2:
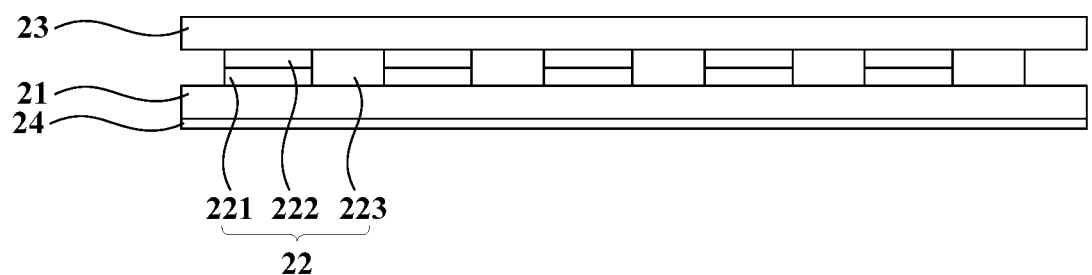
FIG. 2 is a schematic structural diagram of a display panel according to some embodiments of the present disclosure.

FIG. 2 is a schematic structural diagram of the display panel that can be applied to a handwriting screen according to an embodiment of the present disclosure. The display panel includes a substrate 21 and a plurality of pixel units 22.

As shown in FIG. 2, the plurality of pixel units 22 is on the substrate 21. Each of the pixel units 22 includes a sub-pixel unit 223, a control unit 221 and a protection unit 222. The control unit 221 is electrically connected to the sub-pixel unit 223. In the case that the sub-pixel unit 223 is in the display state, the protection unit 222 is configured to prevent the control unit 221 from receiving the interference signal.

In some embodiments of the present disclosure, by providing the protection unit 222 for the control unit 221 in the pixel unit 22, the sub-pixel unit 223 can be prevented from receiving the interference signal when is in the display state, thereby improving the anti-interference capability of the display panel.

Figure 3:
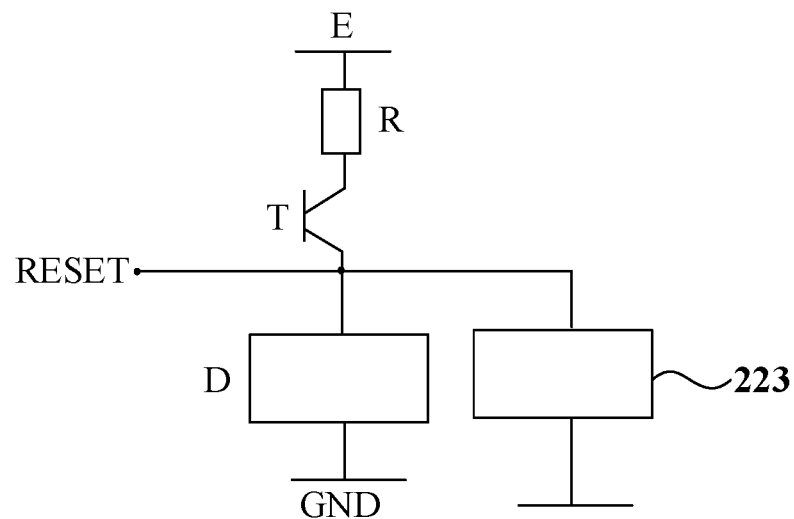
FIG. 3 is a schematic structural diagram of a control unit according to some embodiments of the present disclosure.

In some embodiments, as shown in FIG. 3, the control unit 221 may include a power source E, a photosensitive switch T, a light-emitting device D, a reset signal input terminal RESET and a resistor R. The power source E, the resistor R, the photosensitive switch T and the light-emitting device D are sequentially connected in series; the power source E is further connected to the sub-pixel unit 223 via the resistor R and the photosensitive switch T; the reset signal input terminal RESET is connected to a connection node between the photosensitive switch T and the light-emitting device D; and the light-emitting device D is grounded. The photosensitive switch T switches to a closed state after receiving light in a specified wavelength band; the sub-pixel unit 223 is in the display state; and at the same time, the light-emitting device D is powered and emits the light in the specified wavelength band to the photosensitive switch T in order to maintain the photosensitive switch T in the closed state. When the reset signal input terminal RESET receives a reset signal, the photosensitive switch T is switched to the shutdown state. When the photosensitive switch is switched to the shutdown state, the sub-pixel unit 223 is de-energized and turned off, the light-emitting device D is also de-energized and turned off, and the display panel is reset.

For example, when the user writes on a part of the pixel unit 22 on the display panel, the light in the specified wavelength band is emitted to the photosensitive switch T of the pixel unit in the writing region by an active pen, and the photosensitive switch T switches to the shutdown state after receiving the light in the specified wavelength band. In the closed state, the sub-pixel unit 223 is energized to be in the display state. The light in the specified band may be a display signal. At the same time, the light-emitting device D is also energized, and emits the light in the specified wavelength band to the photosensitive switch T, and the photosensitive switch T can be kept in the closed state even if the active pen leaves or stops emitting the light in the specified wavelength band to the photosensitive switch T. Further the sub-pixel unit 223 is maintained in the display state. And the user can use the active pen to continue writing on the pixel units 22 in another writing region of the display panel.

In some embodiments, the reset signal input terminals RESET in all of the control units 221 on the display panel can be connected together to obtain a reset terminal. In this way, after the reset terminal inputs the reset signal, all the sub-pixel units 223 on the display panel can be reset, and the display panel is initialized to continue writing.

In some embodiments, the photosensitive switch T can be a phototriode, and the light-emitting device D can be a Light Emitting Diode (LED). The phototriode can be a PMOS. A drain is connected to the LED, and the source electrode is connected to the resistor R, but is not limited thereto. The light emitted by the LED can illuminate on a channel of the phototriode, so that the phototriode can be turned on after receiving the light emitted by the LED, so that the phototriode is switched and maintained to be in the closed state. In some embodiments, the light in the specified wavelength band emitted by the active pen and the light in the specified wavelength band emitted by the LED are invisible light. Optionally, the light in the specified band is infrared light. The reset signal can be a low level signal. After the reset signal input terminal Reset receives the low level signal, the phototriode enters a shutdown state, the LED is de-energized, the sub-pixel unit 223 is de-energized, and is switched to the shutdown state, and the display panel is reset.

In some embodiments, as shown in FIG. 2, the protection unit 222 can be above the control unit 221. In the case that the protection unit 222 is in a light-transmitting state, so as to allow the light of the specified wavelength band to be received by the photosensitive switch T through the protection unit 222. The photosensitive switch T receives the light in the specified wavelength band and is switched to the closed state. In the case that the photosensitive switch T is maintained in the closed state, the protection unit 222 is switched to an opaque state for preventing the photosensitive switch T from receiving the interference signal. For example, when the user uses the active pen to write on the display panel, the protection unit 222 is in a light-transmitting state; the light in the specified wavelength band that the active pen emits is received by the photosensitive switch T through the protection unit 222; and after receiving the light in the specified wavelength band, the photosensitive switch T is switched to the closed state so that the sub-pixel unit 223 is in the display state. At the same time, the light-emitting device D is also powered and emits the light in the specified wavelength band to the photosensitive switch T to maintain the closed state of the photosensitive switch T, thereby maintaining the sub-pixel unit 223 in display state. After the photosensitive switch T switched to the closed state, the protection unit 222 is switched to the opaque state, so that the interference signal can be prevented from being received by the photosensitive switch T through the protection unit 222, thereby preventing the interference signal from affecting the normal display of the display panel.

Figure 4:
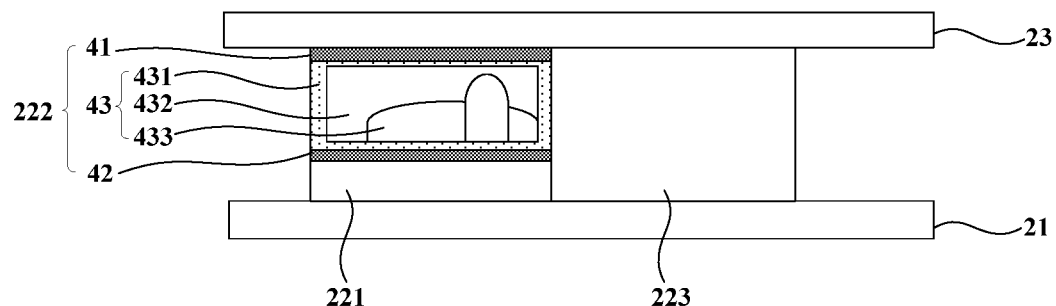
FIG. 4 is a schematic structural diagram of another display panel according to some embodiments of the present disclosure.

In some embodiments, as shown in FIG. 4, the protection unit 222 can include two transparent electrodes 41, 42 and an electrowetting unit 43 between the two transparent electrodes 41, 42. In the case that there is an electric field between the two transparent electrodes 41, 42, the electrowetting unit 43 is in a light-transmitting state, and in the case that there is no electric field between the two transparent electrodes 41, 42, the electrowetting unit 43 is the opaque state.

In some embodiments, as shown in FIG. 4, the electrowetting unit 43 can include a closed housing 431, water 432 and charged oil 433. The water 432 and the charged oil 433 are in the housing 431. In the case that there is an electric field between the two transparent electrodes 41, 42, the charged oil 433 is in a contracted state, and the electrowetting unit 43 is in the light-transmitting state. In the case that there is no electric field between the two transparent electrodes 41, 42, the water surface (an upper surface of the water 432) is covered with the charged oil 433, and the electrowetting unit 43 is in the opaque state. It should be noted that a material of the charged oil 433 and positive, negative and charge amounts of the charged charge can be determined as appropriate.

In some embodiments, the material of the two transparent electrodes 41, 42 is a piezoelectric material.

When the user uses the active pen to write on the display panel, the active pen is used to apply a pressure on a certain writing position of the display panel, and the two transparent electrodes 41, 42 of the pixel unit 22 at the certain writing position generate the electric field after the pressure is induced, and the charged oil 433 is contracted in the electric field, so that a portion of the electrowetting unit 43 that has no charged oil 433 can be transparent, and the light emitted by the active pen can be received by the photosensitive switch T through the protection unit 222. After the photosensitive switch T receives the light emitted by the active pen, the sub-pixel unit 223 is in the display state. At the same time, the light-emitting device D is also energized and emits the light in the specified wavelength hand to the photosensitive switch T to maintain the photosensitive switch T in the closed state and maintain the sub-pixel unit 223 in the display state. In the case that the active pen leaves the certain writing position, the two transparent electrodes 41, 42 do not sense the pressure, the above electric field disappears, the upper surface of the water 432 is covered with the charged oil 433, and an optical signal is not allowed to pass through the protection unit 222. Thus, the photosensitive switch T is protected from an external interference source. Therefore, it is possible to prevent the display panel from being disturbed and causing the misoperation. In the ease that the active pen moves to a next writing position of the display panel and applies the pressure to the next writing position, a display process of the display panel is as described above and will not be repeated here.

In some embodiments, each pixel unit 22 can include one sub-pixel unit 223. The sub-pixel unit 223 can be a white light transparent pixel. In the case that the sub-pixel unit 223 is not powered, the sub-pixel unit 223 is in a transparent state and does not perform display. In the case that the sub-pixel unit 223 is powered, the sub-pixel unit 223 is in the opaque state, that is, a display state. It should be noted that, in actual implementation, each pixel unit 22 may include more than one sub-pixel unit 223. For example, each pixel unit 22 may include three sub-pixel units 223, which may be a red sub-pixel unit, a green sub-pixel unit and a blue sub-pixel unit respectively.

Figure 5:
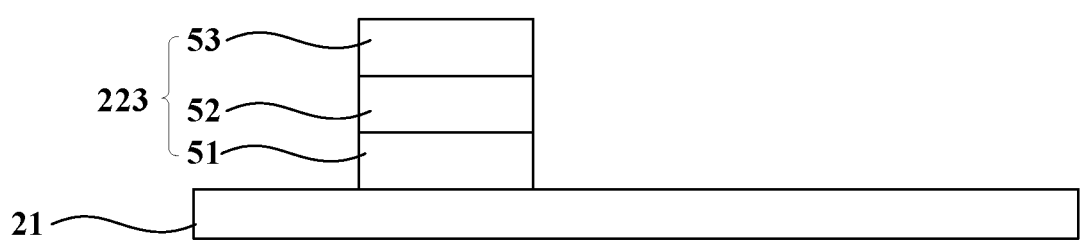
FIG. 5 is a schematic structural diagram of another display panel according to some embodiments of the present disclosure.

In some embodiments, as shown in FIG. 5, the sub-pixel unit 223 may include an Organic Light-Emitting Diode (OLED), and specifically may include an anode 51, a light-emitting layer 52 and a cathode 53. The light-emitting layer 52 is located on the anode 51 and the cathode 53 is located on the light-emitting layer 52. The cathode 53 can be a translucent cathode. The anode 51 can be a transparent anode or a reflective anode. Optionally, the anode 51 is an indium tin oxide semiconductor transparent conductive film (ITO).

In some embodiments, as shown in FIG. 2, the display panel further includes a transparent substrate 23 above the pixel unit 22, and a light reflecting layer 24 on a surface of the substrate 21 facing away from the pixel unit 22. In outdoor bright light conditions, the light reflecting layer 24 can reflect light for compensating a display screen for brightness.

The display panel provided by the embodiment of the present disclosure has strong anti-interference ability can be applied to various complicated environments, and is particularly suitable for a region with complicated space environment, such as a factory and an outdoor environment, thereby improving the quality of the display panel.

An embodiment of the present disclosure further provides a display device, including a display module, and the display panel according to any one of the above embodiments.

In some embodiments, the display device can be a handwriting screen.

In the embodiment of the present disclosure, in that case that the control unit 221 of the pixel unit 22 is provided with the protection unit 222, the sub-pixel unit 223 can prevent the control unit 221 from receiving the interference signal after is in the display state, thereby improving the anti-interference ability of the display device.

Figure 6:
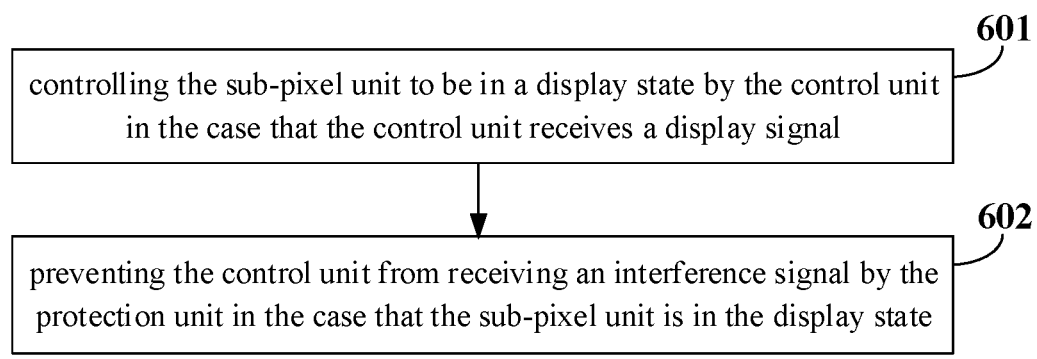
FIG. 6 is a flowchart of a method of controlling a display panel according to some embodiments of the present disclosure.

The embodiment of the present disclosure further provides a method of controlling the display panel, which can be applied to the display panel described in any one of the above embodiments. In some embodiments, the method of controlling the display panel, as shown in FIG. 6, includes the following steps 601-602:

In step 601, controlling the sub-pixel unit to be in a display state by the control unit in the case that the control unit receives a display signal.

In step 602, preventing the control unit from receiving an interference signal by the protection unit in the case that the sub-pixel unit is in the display state.

In the embodiment of the present disclosure, in that case that the control unit 221 of the pixel unit 22 is provided with the protection unit 222, the sub-pixel unit 223 can prevent the control unit 221 from receiving the interference signal after is in the display state, thereby improving the anti-interference capability of the display panel.

It should be noted that the display device in this embodiment may be any product or component having a display function, such as an electronic paper, a mobile phone, a tablet computer, a television, a notebook computer, a digital photo frame, a navigator, and the like.

It is pointed out that in the drawings, the dimensions of layers and regions may be exaggerated for clarity of illustration. It is also understood that when an element or layer is referred to as being "on" another element or layer, the element or layer may be directly contact the surface of the other element or layer, or one side of the other element or layer is not in direct contact or may be arranged within the other element or layer. In addition, it can be understood that when an element or layer is referred to as being "under" another element or layer, it can be directly contacted to the lower surface of the other element or layer or is below the other element or layer and is not in direct contact. In addition, it can also be understood that when a layer or element is referred to as being "between" two or two elements, it can be a single layer between two or two elements, or more than one intermediate layer Or component. Like reference numerals indicate like elements throughout the specification.

In the present disclosure, the terms "first" and "second" are used for descriptive purposes only and are not to be construed as indicating or implying relative importance. The term "plurality" refers to two or more, unless specifically defined otherwise.

Other embodiments of the present disclosure will be readily apparent to those skilled in the art; The present disclosure is intended to cover any variations, uses, or adaptations of the present disclosure, which are in accordance with the general principles of the present disclosure and include common general knowledge or conventional technical means in the art that are not disclosed in the present disclosure. The specification and examples are to be regarded as illustrative only.

It should be understood that the present disclosure is not limited to the precise structure described above and shown in the attached drawings, and that it may be modified or altered in a manner that does not deviate from its scope only by the attached claims

What is claimed is:

1. A display panel comprising:
   a substrate;
   a plurality of pixel units on the substrate; wherein each of the pixel units comprises a sub-pixel unit, a control unit and a protection circuit; the control unit is electrically connected to the sub-pixel unit; in the case that the sub-pixel unit is in a display state, the protection circuit is configured to prevent the control unit from receiving an interference signal,
   wherein the protection circuit is above the control unit;
   in the case that the protection circuit is in a light-transmitting state, the photosensitive switch receives the light in the specified wavelength band, and the photosensitive switch is switched to the closed state;
   in the case that the photosensitive switch is maintained in the closed state, the protection circuit is switched to an opaque state for preventing the photosensitive switch from receiving the interference signal.

2. The display panel according to claim 1, wherein the control unit comprises a power source, a photosensitive switch and a light-emitting device; the power source, the light-sensitive switch and the light-emitting device are sequentially connected in series; and the power source is connected to the sub-pixel unit through the photosensitive switch;
   the photosensitive switch switches to a closed state after receiving light in a specified wavelength band, the sub-pixel unit is in a display state;
   the light-emitting device is powered, and emits the light in the specified wavelength band to the photosensitive switch to maintain the photosensitive switch in the closed state.

3. The display panel according to claim 2, wherein the control unit further comprises a reset signal input terminal; the reset signal input terminal is connected to a connection node between the photosensitive switch and the light-emitting device;
   in the case that the reset signal input terminal receives a reset signal, the photosensitive switch is switched to a shutdown state.

4. The display panel according to claim 2, wherein the control unit further comprises a resistor; the resistor is connected in series between the power source and the photosensitive switch.

5. The display panel according to claim 2, wherein the light-emitting device is grounded.

6. The display panel according to claim 2, wherein the photosensitive switch is a phototriode; the light-emitting device is a LED;
   the light emitted by the LED is illuminated on a channel of the phototriode.

7. The display panel according to claim 1, wherein the protection circuit comprises two transparent electrodes and an electrowetting unit between the two transparent electrodes;
   in the case that there is an electric field between the two transparent electrodes, the electrowetting unit is in the light-transmitting state, and the protection circuit is in the light-transmitting state;
   in the case that there is no electric field between the two transparent electrodes, the electrowetting unit is in the opaque state, and the protection circuit is in the opaque state.

8. The display panel according to claim 7, wherein the electrowetting unit comprises a closed housing, water and charged oil;
   the water and the charged oil are in the housing;
   in the case that there is the electric field between the two transparent electrodes, the charged oil is in a contracted state, and the electrowetting unit is in the light-transmitting state;
   in the case that there is no electric field between the two transparent electrodes, the water surface is covered with the charged oil, and the electrowetting unit is in the opaque state.

9. The display panel according to claim 7, wherein a material of the two transparent electrodes is a piezoelectric material.

10. A display device comprising the display panel of claim 1.

11. The display device according to claim 10, wherein the control unit comprises a power source, a photosensitive switch and a light-emitting device; the power source, the light-sensitive switch and the light-emitting device are sequentially connected in series; the power source is also connected to the sub-pixel unit via the light-sensitive switch;
- the photosensitive switch switches to a closed state after receiving light in a specified wavelength band, the sub-pixel unit is in a display state;
- the light-emitting device is powered, and emits the light in the specified wavelength band to the photosensitive switch to make the photosensitive switch maintain in the closed state.

12. The display device according to claim 11, wherein the control unit further comprises a reset signal input terminal; the reset signal input terminal is connected to a connection node between the photosensitive switch and the light-emitting device;
- in the case that the reset signal input terminal receives a reset signal, the photosensitive switch is switched to the shutdown state.

13. The display device according to claim 11, wherein the control unit further comprises a resistor; the resistor is connected in series between the power source and the photosensitive switch; the light-emitting device is grounded; and the photosensitive switch is a phototriode; the light-emitting device is a LED; and light emitted by the LED is irradiated on a channel of the phototriode.

14. The display device according to claim 10, wherein the protection circuit comprises two transparent electrodes and an electrowetting unit between the two transparent electrodes;
- in the case that there is an electric field between the two transparent electrodes, the electrowetting unit is in the light-transmitting state, and the protection circuit is in the light-transmitting state;
- in the case that there is no electric field between the two transparent electrodes, the electrowetting unit is in the opaque state, and the protection circuit is in the opaque state.

15. The display device according to claim 14, wherein
- the electrowetting unit comprises a closed housing, water and charged oil;
- the water and the charged oil are in the housing;
- in the case that there is the electric field between the two transparent electrodes, the charged oil is in a contracted state, and the electrowetting unit is in the light-transmitting state;
- in the case that there is no electric field between the two transparent electrodes, the water surface is covered with the charged oil, and the electrowetting unit is in the opaque state.

16. The display device according to claim 14, wherein the material of the two transparent electrodes is a piezoelectric material.

17. The display device according to claim 10, wherein the display device is a handwriting screen.

18. A method of controlling a display panel, wherein the display panel comprises a substrate and a plurality of pixel units on the substrate; each of the pixel units comprises a sub-pixel unit, a control unit and a protection circuit; the control unit is electrically connected to the sub-pixel unit; the method comprises:
- controlling the sub-pixel unit to be in a display state by the control unit in the case that the control unit receives a display signal;
- preventing the control unit from receiving an interference signal by the protection circuit in the case that the sub-pixel unit is in the display state,
- wherein the protection circuit is above the control unit;
- in the case that the protection circuit is in a light-transmitting state, the photosensitive switch receives the light in the specified wavelength band, and the photosensitive switch is switched to the closed state;
- in the case that the photosensitive switch is maintained in the closed state, the protection circuit is switched to an opaque state for preventing the photosensitive switch from receiving the interference signal.

* * * * *